United States Patent
Yang

(10) Patent No.: US 7,749,810 B2
(45) Date of Patent: Jul. 6, 2010

(54) METHOD OF PACKAGING A MICROCHIP HAVING A FOOTPRINT THAT IS LARGER THAN THAT OF THE INTEGRATED CIRCUIT

(75) Inventor: Jae Pil Yang, Cote d'Azur (SG)

(73) Assignee: Analog Devices, Inc., Norwood, MA (US)

( * ) Notice: Subject to any disclaimer, the term of this patent is extended or adjusted under 35 U.S.C. 154(b) by 630 days.

(21) Appl. No.: 11/760,429

(22) Filed: Jun. 8, 2007

(65) Prior Publication Data

US 2008/0303151 A1 Dec. 11, 2008

(51) Int. Cl.
*H01L 21/44* (2006.01)
(52) U.S. Cl. .................. 438/114; 438/106; 438/113
(58) Field of Classification Search .............. 438/106, 438/113, 114
See application file for complete search history.

(56) References Cited

U.S. PATENT DOCUMENTS

| | | | | |
|---|---|---|---|---|
| 3,809,050 A | * | 5/1974 | Chough et al. ............. | 125/35 |
| 5,609,954 A | * | 3/1997 | Aizawa et al. ............ | 428/317.5 |
| 6,720,212 B2 | | 4/2004 | Robl et al. .................. | 438/132 |
| 6,724,076 B1 | | 4/2004 | Kahlisch et al. ............. | 257/680 |
| 2005/0116324 A1 | | 6/2005 | Yamaguchi ................. | 257/678 |
| 2005/0124093 A1 | | 6/2005 | Yang et al. .................. | 438/110 |
| 2006/0163728 A1 | | 7/2006 | Nakanishi et al. ........... | 257/738 |

OTHER PUBLICATIONS

M. Brunnbauer et al., *Embedded Wafer Level Ball Grid Array (eWLB)*, 2006 Electronics Packaging Technology Conference (IEEE), 5 pages.
Authorized Officer Jean-Pierre Stirn, *The International Search Report and the Written Opinion of the International Searching Authority*, International Application No. PCT/US2008/057994, International Searching Authority, Jul. 1, 2008, 10 pages.

* cited by examiner

*Primary Examiner*—Thanh V Pham
(74) *Attorney, Agent, or Firm*—Sunstein Kann Murphy & Timbers LLP

(57) ABSTRACT

A method of packaging an integrated circuit singulates a wafer to form an integrated circuit, positions the integrated circuit on a carrier, and passivates the integrated circuit after the positioning the integrated circuit on the carrier. At this point, the integrated circuit is secured to the carrier. The method also electrically connects the integrated circuit to a plurality of exposed conductors.

14 Claims, 6 Drawing Sheets

METHOD OF PACKAGING A MICROCHIP HAVING A FOOTPRINT THAT IS LARGER THAN THAT OF THE INTEGRATED CIRCUIT

FIELD OF THE INVENTION

The invention generally relates to integrated circuits and, more particularly, the invention relates to packaging integrated circuits.

BACKGROUND OF THE INVENTION

The semiconductor industry employs a wide variety of techniques to package integrated circuits. For example, one technique encapsulates an integrated circuit within molded plastic. Such a technique often is generically referred to as one type of "package level packaging." The final packaged integrated circuit using this technique often has a footprint that is much larger than that of the integrated circuit. Accordingly, such a packaged integrated circuit has a relatively large area to attach many interface conductors, such as a ball grid array. Consequently, the integrated circuit has many input and output ports (e.g., many balls of a large ball grid array) for electrically communicating with other, external components.

Another technique protects the sensitive portions of the chip (e.g., exposed conductors) with a passivation layer that exposes certain conductors (e.g., electrical contacts). The exposed conductors of the integrated circuit can be processed for connection with external components (e.g., a printed circuit board). This latter technique often is generically referred to as one type of "wafer level packaging." In a manner similar to the noted package level packaging technique, wafer level packaging typically has a limited footprint; namely, about the footprint of the integrated circuit. Accordingly, this type of package has less space to attach interface conductors, thus limiting the number of input and output ports for communicating with other, external components.

SUMMARY OF THE INVENTION

In accordance with one embodiment of the invention, a method of packaging an integrated circuit singulates a wafer to form an integrated circuit, positions the integrated circuit on a carrier, and passivates the integrated circuit after the positioning the integrated circuit on the carrier. At this point, the integrated circuit is secured to the carrier. The method also electrically connects the integrated circuit to a plurality of exposed conductors.

The wafer may have a plurality of integrated circuits. In that case, the method may dice the wafer to form a plurality of integrated circuits, and then position the plurality of singulated integrated circuits on the carrier. In a similar manner, the method may also dice/singulate the carrier. Among other things, the plurality of exposed conductors may form a ball grid array.

The method may form forming a plurality of passivation layers during its passivation process. To that end, the method may form a first passivation layer on the integrated circuit, and then form a conductive path on at least a portion of the first passivation layer. The conductive path electrically connects with the integrated circuit. Next, the method may form a second passivation layer on at least a portion of the conductive path.

The carrier preferably is relatively rigid at thicknesses of at least about 0.4 millimeters. For example, the carrier may be at least partially formed from at least one of a metal material, a printed circuit board, or silicon wafer. In some embodiments, the method laminates the back side of the integrated circuit with a die attach film. In other embodiments, the method uses the film and/or an epoxy and adhesive.

In accordance with another embodiment of the invention, an integrated circuit packaging method provides an array of integrated circuits formed on a wafer, dices the wafer to form a plurality of integrated circuits, and positions a set of the plurality of integrated circuits on a rigid carrier. The method also passivates the set of integrated circuits on the carrier with a passivation material, and electrically connects the integrated circuit to a plurality of exposed conductors at least partially secured to the passivation material.

In accordance with another aspect of the invention, an integrated circuit packaging method singulates a wafer to form an integrated circuit having a length and a width. After singulating the wafer, the method positions the integrated circuit on a rigid carrier, and passivates the integrated circuit on the carrier with a passivation material. This passivation material also is on the carrier. The method also electrically connects the integrated circuit to a plurality of exposed conductors at least partially secured to the passivation material. At least one of the exposed conductors is located beyond at least one of the length or width of the integrated circuit.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIG. 3 also illustrates step 200 of the process shown in FIG. 2.

FIG. 4 also illustrates step 210 of the process shown in FIG. 2.

DESCRIPTION OF ILLUSTRATIVE EMBODIMENTS

In illustrative embodiments, a wafer level process packages an integrated circuit in a manner that increases the circuit footprint. As a result, the final packaged device may have more electrical interfaces (e.g., balls of a ball grid array) for connecting with external devices. In fact, those interfaces may be larger and/or have a wider pitch. Moreover, illustrative embodiments also facilitate standardization of electrical interfaces. To those ends, such processes mount an integrated circuit to a carrier, passivate the integrated circuit and carrier, and then apply electrical interfaces to the passivated regions. Details of illustrative embodiments are discussed below.

Figure 1:
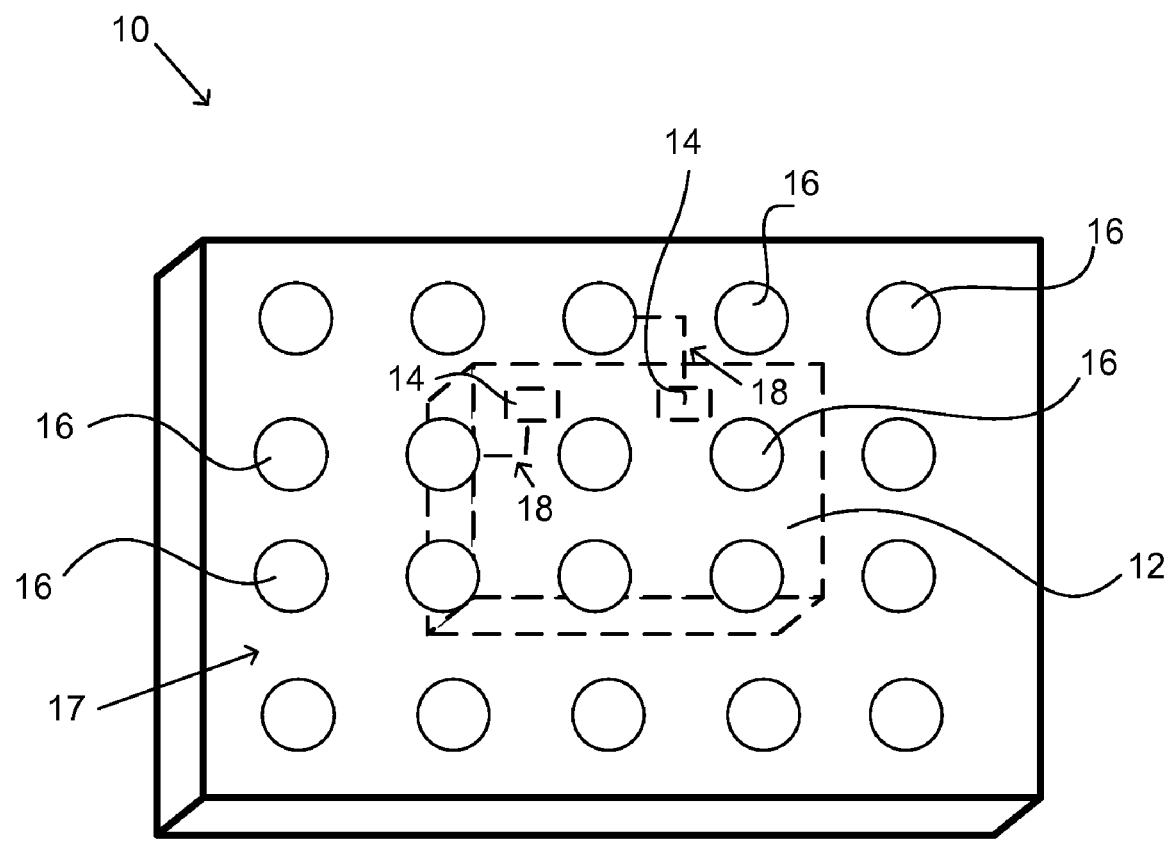
FIG. 1 schematically shows a perspective, top view of a packaged microchip (e.g., a fanout wafer level chip scale package) that may be produced in accordance with illustrative embodiments of the invention.

FIG. 1 schematically shows a perspective, top view of a packaged integrated circuit 10 produced in accordance with illustrative embodiments of the invention. Specifically, the packaged integrated circuit 10 shown in FIG. 1 has a body that encapsulates an interior integrated circuit 12. The integrated circuit 12, which is shown in phantom in FIG. 1, has electrical interfaces (e.g., bond pads 14) that connect with exposed interfaces (e.g., balls 16 of a ball grid array 17) on one exterior package surface. Conductive paths interior to the package, such as metal traces 18, may provide this electrical connection.

The exposed interfaces on the package surface may be any conventional interfaces, such as the noted ball grid array 17. The ball grid array 17 may be standardized to the size required for a given application. For example, the ball grid array 17 may be a 4×4 array, a 5×4 array, a 5×5 array, a 10×10 array, etc. . . . It nevertheless should be noted that discussion of a ball grid array 17 or other interfaces is for illustrative purposes only and not intended to limit various aspects of invention.

As discussed in greater detail below respect to FIG. 2, the body of the package is formed substantially of passivation material 20, such as one or more of silicon nitride, polyamide, or benzocyclotine butane (known in the art as "BCB"), and a carrier 26 (not shown in FIG. 1). Moreover, the integrated circuit 12 may be any type integrated circuit that one of ordinary skill the art would consider adaptable for this process. For example, the integrated circuit 12 may essentially consist of circuit elements that form an analog to digital converter. As another example, the integrated circuit 12 may have microstructure forming a MEMS device (e.g., a MEMS accelerometer or a MEMS microphone). In that case, the MEMS device requires some kind of protection for its resident microstructure. Accordingly, if the integrated circuit 12 is a MEMS device, it is anticipated that the microstructure would be capped or have some similar protection apparatus for the microstructure.

Figure 2:
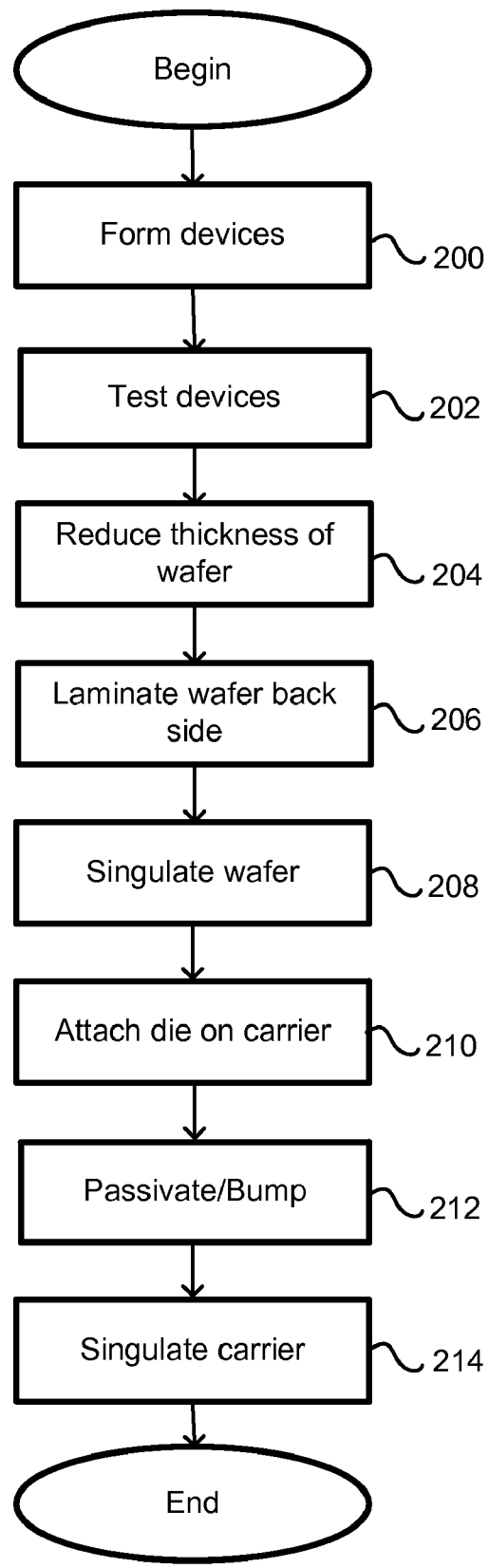
FIG. 2 shows a wafer level process of packaging an integrated circuit in accordance with illustrative embodiments of the invention.
Figure 3:
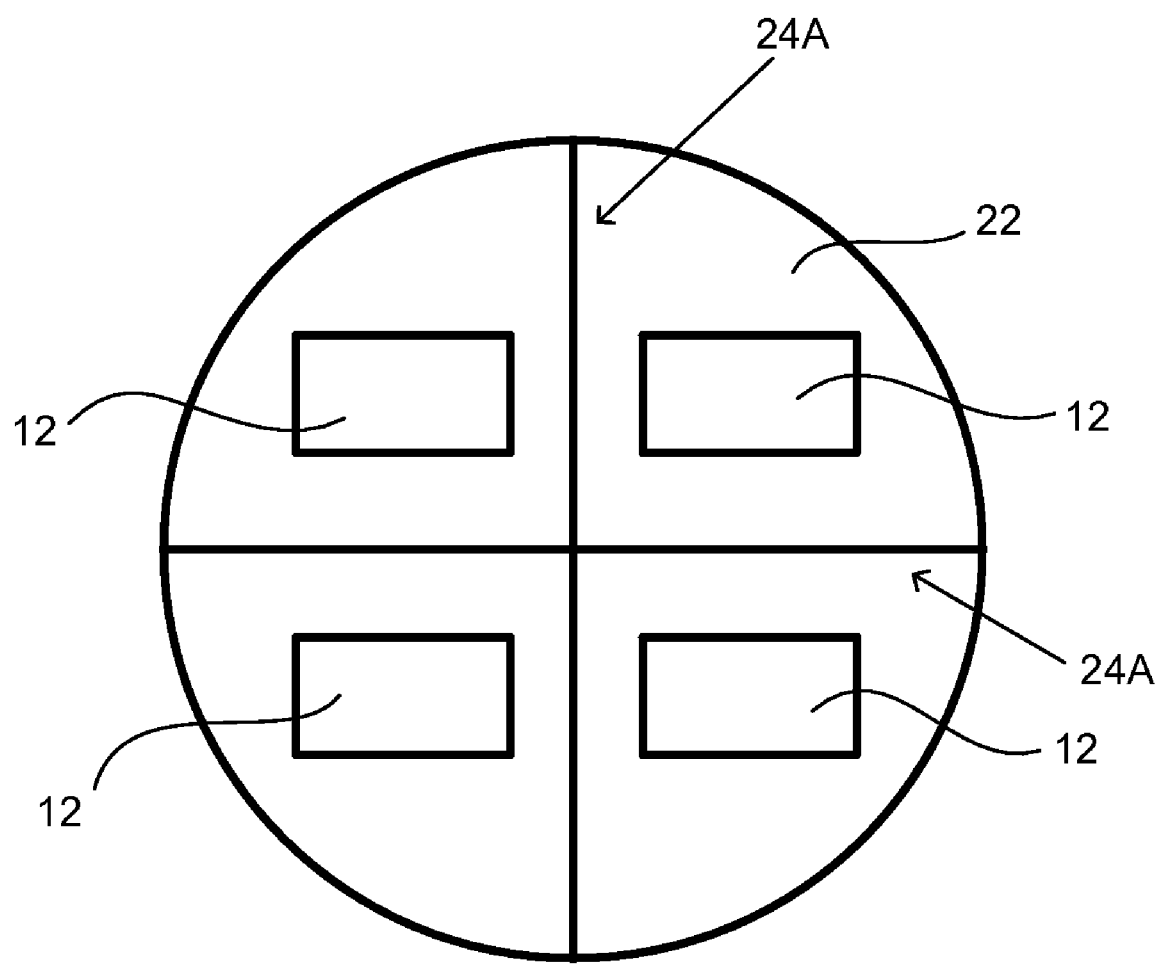
FIG. 3 schematically shows a wafer having four devices that may be packaged in accordance with the process shown in FIG. 2.

FIG. 2 shows a process of forming the packaged integrated circuit 10 shown in FIG. 1. Those skilled in the art may consider this process a wafer level process. The process begins at step 200 by forming a plurality of integrated circuits/microchips 12 on a wafer 22 in a conventional manner. To that end, illustrative embodiments take advantage of conventional batch processing by forming a two-dimensional array of integrated circuits 12 on a single wafer 22. For example, FIG. 3 schematically shows a top view of a wafer 22 having a 2×2 array of integrated circuits 12. To facilitate subsequent dicing steps, the wafer 22 also has a plurality of scribe streets 24A between the integrated circuits 12.

It should be noted that some embodiments have many more or fewer integrated circuits 12, or asymmetrical arrays of integrated circuits 12 on a single wafer 22. In fact, some embodiments may form a single integrated circuit 12 on one wafer 22. Accordingly, discussion of 2×2 array of FIG. 3 is for illustrative purposes only.

After forming the array of integrated circuits 12 on the wafer 22, the process continues to step 202 by testing each of the integrated circuits 12 in a conventional manner. For example, conventional probing processes may confirm effective operation and function of the various internal components of each integrated circuit 12. It should be noted that in a manner similar to some other steps, this testing step is optional. Some embodiments may not test at all, or test at some other time.

The process then may reduce the thickness of the wafer 22 in a conventional manner (step 204). For example, the process may apply conventional backgrinding techniques to the back side of the wafer 22. As another example, the process may reduce the thickness of the wafer 22 by using chemical processes, such as etching acids. Some embodiments may reduce the thickness of the wafer 22 by using techniques taught in US Publication Number 2006-0027522, the disclosure of which is incorporated herein, in its entirety, by reference. Of course, in some instances, this step may be omitted because the wafer 22 has a sufficient thickness for the anticipated application.

To couple the integrated circuits 12 with one or more carriers 26, the process may laminate the backside of the wafer 22 with an adhesive (step 206). For example, the process may apply a conventional die attach film 28 to the backside of the wafer 22. At this point the process, the wafer 22 is ready to be cut/diced into individual integrated circuits 12. This process is generally known the art as "singulation."

Accordingly, the process continues to step 208, which dices the wafer 22 along the scribe streets 24A shown in FIG. 3. Again, in a manner similar to other steps, conventional techniques can be used, such as those that use saw blades or lasers (not shown).

Figure 4:
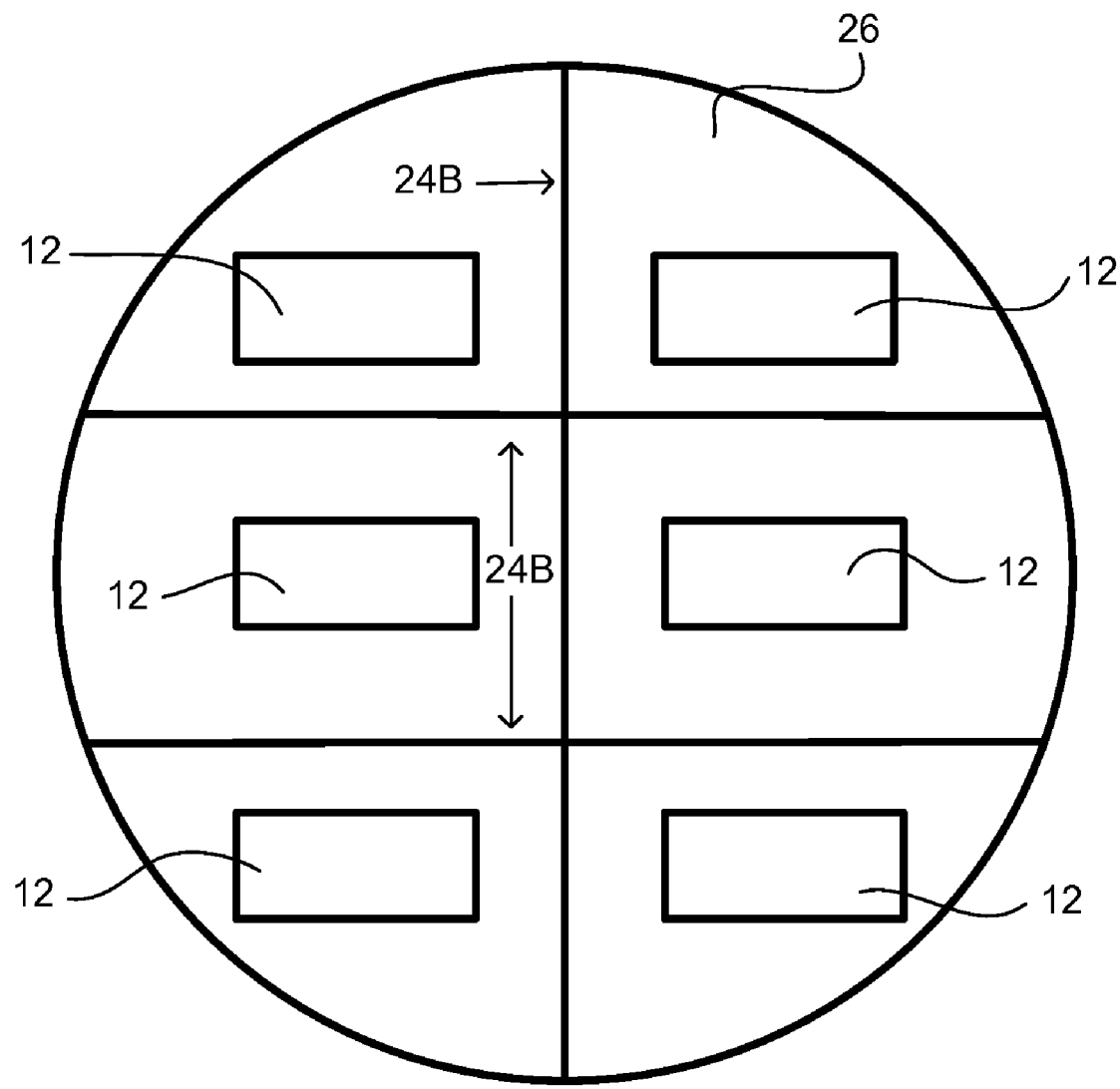
FIG. 4 schematically shows a carrier having six devices affixed to it.

The process then selectively attaches a set of the integrated circuits 12 to a single carrier 26 (step 210, referred to as a "die attach" step). For example, FIG. 4 schematically shows a single carrier 26 having a 3×2 array of six integrated circuits 12 and scribe streets 24B that facilitate a subsequent singulation step. It should be noted that, in a manner similar to the above discussion regarding FIG. 3, discussion of a 3×2 array is illustrative and not intended to limit various aspects of the invention. More or fewer integrated circuits 12, or asymmetrical arrays of integrated circuits 12, may be attached to a single carrier 26. In fact, some embodiments may attach a single integrated circuit 12 on one carrier 26. Accordingly, discussion of 3×2 array of FIG. 4 is for illustrative purposes only.

To that end, the process illustratively first effectively discards integrated circuits 12 that did not meet the performance specifications required of the tests of step 202. Accordingly, a single carrier 26 may have integrated circuits 12 from a single wafer 22 only, or from multiple, different wafers 22. The process therefore attaches one or more of the remaining integrated circuits 12 to the noted carrier 26. For example, a robotic arm may position the integrated circuits 12 in an array on the single carrier 26. Next, the process may cure the die attach film 28 on the back sides of each integrated circuit 12 (e.g., using a UV cure), thus mechanically connecting integrated circuits 12 to the carrier 26. Of course, some embodiments may use other techniques for attaching the integrated circuits 12 onto the carrier 26. Discussion of the die attach film 28 thus is illustrative and not intended to limit many embodiments.

The carrier 26 may be any one of a plurality of different devices having a sufficient rigidity for the anticipated application. For example, the carrier 26 may be a silicon wafer, a metal plate, or a substrate (i.e., printed circuit board material, such as BT resin FR-4) having a thickness as low as 0.3 to 0.4 millimeters (or even lower in some instances). The thickness also may be higher. Accordingly, discussion of specific thicknesses is illustrative and not intended to limit various embodiments. In preferred embodiments, to ensure appropriate rigidity, the carrier 26 is not an injection molded material, such as plastic. In other words, preferred embodiments use non-molded materials as a carrier 26.

Figure 5:
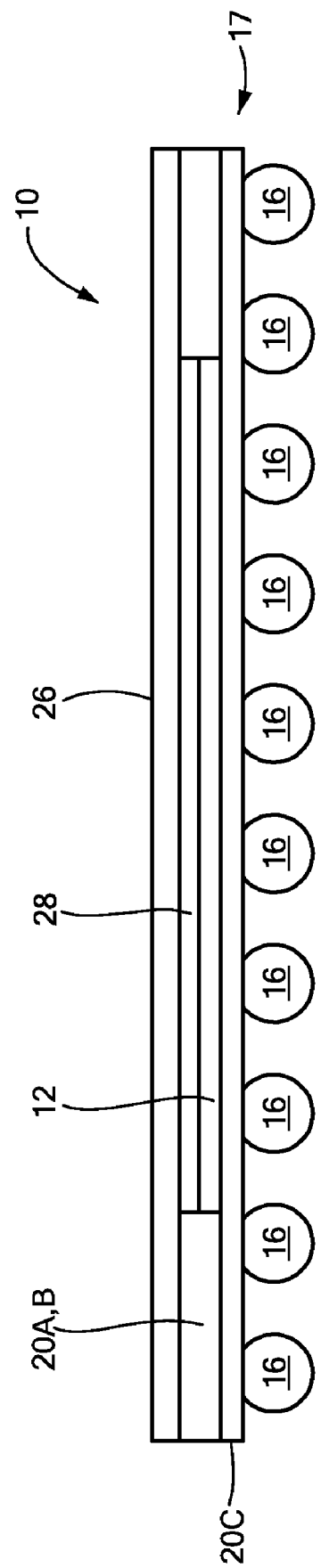
FIG. 5 schematically shows a generalized cross-sectional view of a packaged microchip produced in accordance with illustrative embodiments of the invention.

The process continues to step 212, which passivates the integrated circuit 12 and carrier 26, and forms the ball grid array 17 shown in FIG. 1. Such a step may incorporate many steps of conventional "bump processes." To that end, FIG. 5 schematically shows a generalized cross-sectional view of an integrated circuit 12 packaged by this process shown by FIG. 2. Specifically, FIG. 5 shows the die connected to the carrier 26 by means of the die attach film 28 discussed above. In addition, FIG. 5 also shows passivation and metallization layers 20 and 18 formed by bump processes.

Figure 6:
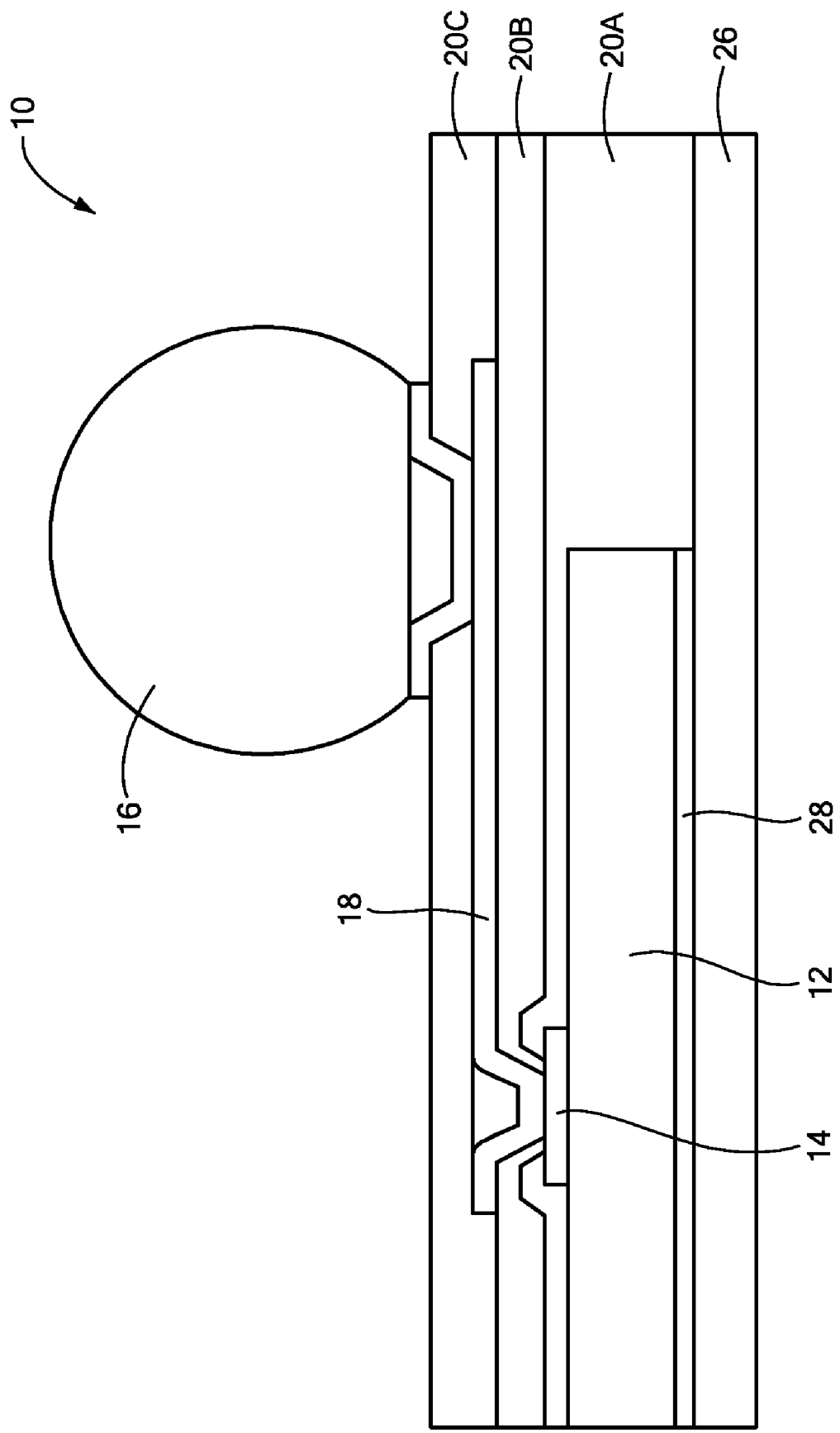
FIG. 6 schematically shows a more detailed cross-sectional view of a packaged microchip produced in accordance with illustrative embodiments of the invention.

FIG. 6, in conjunction with FIG. 5, shows additional details of the bump process of step 212. Among other things, the bump process shown in FIG. 6 produces three passivation layers 20A, 20B, and 20C. The first passivation layer 20A substantially planarizes the carrier 26 and the integrated circuits 12 while permitting the integrated circuit bond pads 14 to remain exposed. For example, the first passivation layer 20A may be a silicon polyimide or BCB. In some embodiments, the first passivation layer 20A is only to the side of the integrated circuit 12. In other embodiments, the first passivation layer 20A also is on the top surface of the integrated circuit 12.

The process then may add a second passivation layer 20B that covers both for the first passivation layer 20A and bond pads 14. The process then may mask all but the bond pad areas of the second passivation layer 20B to remove the second passivation layer 20B in the areas of the bond pads 14.

After exposing the bond pads 14, the process may form and pattern metallization 18 extending from the bond pads 14 to the top surface of the second passivation layer 20B. For example, the metallization layer 18 may form metal runners from the bond pads 14. The third of the three passivation layers 20C then may be added to cover the metallization 18 and second passivation layer 20B. Again, the process may mask certain portions of the third passivation layer 20C to expose a metal runners/layer 18. At that point, solder balls 16 may be coupled to the passivation layers 20A, 20B and 20C by means of some intermediate conductor. In other words, the solder ball 16 electrically connects to one or more of the bond pads 14 on the integrated circuit 12 by means of the metallization layer 18.

It should be noted, however, that discussion of three passivation layers 20A, 20B, and 20C is but one of many different ways of implementing illustrative embodiments. For example, some embodiments may omit the first layer and simply use the second and third layers 20B and 20C. In fact, some embodiments may use the same or different materials for passivation (e.g., one or more of silicon nitride, polyamide, or BCB). In fact, two adjacent passivation layers of the same material may effectively integrate to form a single passivation layer. Accordingly, various embodiments may use other passivation techniques.

The process then concludes at step 214, which singulates the carrier 26, passivation 20, etc. . . . (along the scribe streets 24B) into a plurality individual packaged integrated circuits 10 as shown in FIG. 1. Accordingly, in a manner similar to step 208, conventional processes may use saw blades or other devices to form individual packaged integrated circuits 10, such as that shown in FIG. 1.

FIGS. 1 and 5 (and FIG. 6 to some extent) schematically show one advantage of various embodiments; namely, permitting more balls 16 to be coupled to the bottom side of a wafer level package. Specifically, as shown in FIG. 1, the integrated circuit chip/die 12 has a length dimension and a width dimension. Thus, as shown in FIGS. 1 and 5, illustrative embodiments enable balls 16 to be coupled beyond the length, width, or both, of the integrated circuit 12. Moreover, in addition to enabling more balls 16 to form the ball grid array 17, illustrative embodiments enable the balls 16 to have wider pitches. Prior art wafer level packaging techniques known to the inventor do not enable these advantages because they are limited to the effective footprint of the integrated circuit 12. Moreover, illustrative embodiments stop processing defective integrated circuits 12 earlier in the process (e.g., before bump processes), thus eliminating some unnecessary processing steps.

Although the above discussion discloses various exemplary embodiments of the invention, it should be apparent that those skilled in the art can make various modifications that will achieve some of the advantages of the invention without departing from the true scope of the invention.

What is claimed is:

1. An integrated circuit packaging method comprising:
   laminating the back side of a wafer with a die attach film;
   singulating the wafer to form an integrated circuit, the integrated circuit having a length and a width;
   positioning the integrated circuit on a rigid carrier;
   passivating the integrated circuit on the carrier with a passivation material, the passivation material also being on the carrier; and
   electrically connecting the integrated circuit to a plurality of exposed conductors at least partially secured to the passivation material, at least one of the exposed conductors being located beyond at least one of the length or width of the integrated circuit;
   the method further comprising singulating the carrier to form a packaged integrated circuit.

2. A wafer level method of packaging an integrated circuit, the method comprising:
   laminating the back side of a wafer with a die attach film;
   singulating the wafer to form an integrated circuit;
   positioning the integrated circuit on a carrier;
       passivating the integrated circuit after the positioning the integrated circuit on the carrier, the integrated circuit being secured to the carrier; and
   electrically connecting the integrated circuit to a plurality of exposed conductors;
   wherein passivating comprises:
       forming a first passivation layer on the integrated circuit and on the carrier;
       forming a conductive path on at least a portion of the first passivation layer, the conductive path electrically connected with the integrated circuit to the exposed conductors; and
       forming a second passivation layer on at least a portion of the conductive path;
   the method further comprising dicing the carrier.

3. The method as defined by claim 2 wherein the wafer has a plurality of integrated circuits, singulating comprising dicing the wafer to form a plurality of integrated circuits and positioning the plurality of integrated circuits on the carrier.

4. The method as defined by claim 2 wherein the plurality of exposed conductors forms a ball grid array.

5. The method as defined by claim 2 wherein the carrier comprises at least one of a metal material, a printed circuit board, or silicon wafer.

6. The method as defined by claim 2 wherein the carrier is relatively rigid at thicknesses of at least about 0.4 millimeters.

7. An apparatus formed by the process of claim 2.

8. An integrated circuit packaging method comprising:
   providing an array of integrated circuits formed on a wafer;
   laminating the back side of the wafer with a die attach film;
   dicing the wafer to form a plurality of integrated circuits;
   positioning a set of the plurality of integrated circuits on a rigid carrier;
   passivating the set of integrated circuits on the carrier with a passivation material; and
   electrically connecting the set of integrated circuits to a plurality of exposed conductors at least partially secured to the passivation material;

wherein passivating comprises:

forming a first passivation layer over the set of the plurality of integrated circuits on the rigid carrier;

forming a plurality of conductive paths on the first passivation layer to the exposed conductors, each conductive path electrically connected with no more than one of the set of the plurality of integrated circuits; and forming a second passivation layer over a portion of each conductive path;

the method further comprising dicing the carrier to form a plurality of packaged integrated circuits.

9. The method as defined by claim 8 further comprising testing the set of integrated circuits before positioning, the set of integrated circuits positioned on the rigid carrier comprising integrated circuits that satisfy the testing requirements.

10. The method as defined by claim 8 wherein at least one of the integrated circuits has a length and a width, at least one exposed conductors being located beyond at least one of the length and the width of the integrated circuit.

11. An apparatus formed in accordance with the process of claim 10.

12. The method as defined by claim 10 wherein the plurality of exposed conductors forms a ball grid array.

13. The method as defined by claim 8 further comprising backgrinding the wafer.

14. The method as defined by claim 8 wherein the carrier is a non-molded component.

* * * * *